US012727271B2

(12) United States Patent
Li et al.

(10) Patent No.: US 12,727,271 B2
(45) Date of Patent: Sep. 1, 2026

(54) IMAGE SENSOR

(71) Applicant: VisEra Technologies Company Ltd., Hsin-Chu City (TW)

(72) Inventors: Ching-Hua Li, Hsin-Chu City (TW); Chun-Yuan Wang, Hsin-Chu City (TW); Zong-Ru Tu, Hsin-Chu City (TW); Po-Hsiang Wang, Hsin-Chu City (TW)

(73) Assignee: VisEra Technologies Company Ltd., Hsin-Chu City (TW)

( * ) Notice: Subject to any disclaimer, the term of this patent is extended or adjusted under 35 U.S.C. 154(b) by 1009 days.

(21) Appl. No.: 17/955,208

(22) Filed: Sep. 28, 2022

(65) Prior Publication Data

US 2024/0105744 A1 Mar. 28, 2024

(51) Int. Cl.
*H10F 39/00* (2025.01)
*H10F 39/18* (2025.01)

(52) U.S. Cl.
CPC ......... *H10F 39/806* (2025.01); *H10F 39/182* (2025.01); *H10F 39/8053* (2025.01); *H10F 39/8063* (2025.01); *H10F 39/807* (2025.01)

(58) Field of Classification Search
CPC .. H10F 39/806; H10F 39/182; H10F 39/8053; H10F 39/8063; H10F 39/807; H10F 39/805
See application file for complete search history.

(56) References Cited

U.S. PATENT DOCUMENTS

| | | | |
|---|---|---|---|
| 9,437,645 B1 | 9/2016 | Chou et al. | |
| 2006/0138497 A1 | 6/2006 | Kim | |
| 2006/0278906 A1 | 12/2006 | Vaillant | |
| 2015/0137296 A1 | 5/2015 | Chen et al. | |
| 2017/0012066 A1* | 1/2017 | Choi | H10F 39/807 |
| 2020/0350352 A1* | 11/2020 | Nakamoto | H10F 39/8057 |

FOREIGN PATENT DOCUMENTS

| | | |
|---|---|---|
| CN | 113272962 A | 8/2021 |
| CN | 114464635 A | 5/2022 |
| CN | 114843291 A | 8/2022 |
| JP | H0566370 A | 3/1993 |
| JP | 2005057024 A | 3/2005 |
| JP | 2006261248 A | 9/2006 |

(Continued)

*Primary Examiner* — Jessica S Manno
*Assistant Examiner* — Ricky Verdes
(74) *Attorney, Agent, or Firm* — LIU & LIU

(57) ABSTRACT

An image sensor includes a photoelectric conversion layer, a plurality of deep trench isolations, a first color filter, a first deflector, and a covering layer. The photoelectric conversion layer includes a first photodiode and a second photodiode. The deep trench isolations separate the first photodiode and the second photodiode, in which a pixel dimension is determined by a distance between two adjacent deep trench isolations. The first color filter is disposed on the first photodiode and the second photodiode. The first deflector is disposed on the first color filter. The covering layer covers and surrounds the first deflector. A refractive index of the covering layer is greater than a refractive index of the first deflector, and a difference value between the refractive index of the covering layer and the refractive index of the first deflector is in a range from 0.15 to 0.6.

20 Claims, 15 Drawing Sheets

(56) References Cited

FOREIGN PATENT DOCUMENTS

| | | | |
|---|---|---|---|
| JP | 2011238636 | A | 11/2011 |
| JP | 2015032610 | A | 2/2015 |
| JP | 2018201015 | A | 12/2018 |
| JP | 2020065797 | A | 4/2020 |
| KR | 20020057277 | A | 7/2002 |
| KR | 20220111170 | A | 8/2022 |
| TW | 201417257 | A | 5/2014 |
| TW | 202220198 | A | 5/2022 |
| WO | 2017110515 | A | 6/2017 |

* cited by examiner

300B

300A

1900

IMAGE SENSOR

BACKGROUND

Field of Invention

The present disclosure relates to an image sensor. More particularly, the present disclosure relates to a deflector in the image sensor.

Description of Related Art

In the field of complementary metal oxide semiconductor (CMOS) image sensor (also known as CIS), there may be a lens layer, a color filter layer and a plurality of photodiodes in an image sensor. The lens layer is disposed to receive external light, and the photodiodes are disposed to detect the light, in which photodiodes could be separated by a plurality of deep trench isolations (DTIs). However, the exist of DTIs may cause the imbalance of energy distribution of external light when the lens layer is misaligned with the color filter layer and/or the photodiodes. Therefore, there is a need to solve the light-spot shifting issue problem.

SUMMARY

One aspect of the present disclosure is to provide an image sensor. The image sensor includes a photoelectric conversion layer, a plurality of deep trench isolations, a first color filter, a first deflector, and a covering layer. The photoelectric conversion layer includes a first photodiode and a second photodiode. The deep trench isolations separate the first photodiode and the second photodiode, in which a pixel dimension is determined by a distance between two adjacent deep trench isolations. The first color filter is disposed on the first photodiode and the second photodiode. The first deflector is disposed on the first color filter. The covering layer covers and surrounds the first deflector. A refractive index of the covering layer is greater than a refractive index of the first deflector, and a difference value between the refractive index of the covering layer and the refractive index of the first deflector is in a range from 0.15 to 0.6.

In some embodiments, a ratio of a top width of the first deflector to a bottom width of the first deflector is in a range from ¼ to 1.

In some embodiments, a ratio of a bottom width or a bottom length of the first deflector to the pixel dimension is in a range from 1 to 1.8, and the bottom width of the first deflector is the same as the bottom length of the first deflector.

In some embodiments, a gap between a sidewall of the first color filter and a sidewall of a bottom of the first deflector is in a range from 0.1 to 0.5 pixel dimension.

In some embodiments, the image sensor further includes a third photodiode, a fourth photodiode, a second color filter, and a second deflector. The third photodiode and the fourth photodiode are in the photoelectric conversion layer, in which the deep trench isolations separate the third photodiode and the fourth photodiode. The second color filter is disposed on the third photodiode and the fourth photodiode. The second deflector is disposed on second color filter. The second deflector is spaced apart from the first deflector, both of the first deflector and the second deflector extend along a first direction and arranged in a second direction perpendicular to the first direction. The covering layer covers and surrounds the second deflector.

In some embodiments, a ratio of a bottom width or a bottom length of the first deflector to the pixel dimension is in a range from 1 to 1.8, and a ratio of a bottom width or a bottom length of the second deflector to the pixel dimension is in a range from 1 to 1.8.

In some embodiments, a difference value between the bottom width and the bottom length of the first deflector is in a range from 0.1 to 0.5 pixel dimension.

In some embodiments, a first gap between a sidewall of the first color filter and a sidewall of a bottom of the first deflector is the same as a second gap between a sidewall of the second color filter and a sidewall of a bottom of the second deflector, in which the first gap is in a range from less than 0.4 pixel dimension.

In some embodiments, a first height of the first deflector is in a range from 150 nm to 800 nm, a second height of the second deflector is in a range from 150 nm to 800 nm, and the first height is different from the second height.

In some embodiments, the image sensor further includes a fifth photodiode, a sixth photodiode, a third color filter, and a third deflector. The fifth photodiode and the sixth photodiode are in the photoelectric conversion layer, in which the deep trench isolations separate the fifth photodiode and the sixth photodiode. The third color filter is disposed on the fifth photodiode and the sixth photodiode. The third deflector is disposed on third color filter. The third deflector is spaced apart from the first deflector and the second deflector, and the third deflector extends along the first direction and arranged in the second direction. The covering layer covers and surrounds the third deflector.

In some embodiments, a bottom width of the first deflector is the same as a bottom width of the second deflector, and a bottom length of the first deflector is the same as a bottom length of the third deflector.

In some embodiments, a bottom width of the first deflector is the same as a bottom width of the third deflector, and a bottom length of the first deflector is the same as a bottom length of the second deflector.

In some embodiments, the image sensor further includes a fifth photodiode, a sixth photodiode, and a third color filter. The deep trench isolations separate the fifth photodiode and the sixth photodiode. The third color filter is disposed on the fifth photodiode and the sixth photodiode. The first deflector and the second deflector are free of disposed on the third color filter.

In some embodiments, a bottom width of the first deflector is the same as a bottom length of the first deflector. The first deflector is disposed above a junction of the first color filter and the second color filter.

In some embodiments, a symmetry axis of a deep trench isolation below the first color filter is misaligned with a symmetry axis of the first deflector. A symmetry axis of a deep trench isolation below the second color filter is misaligned with a symmetry axis of the second deflector. A difference value between an offset of the symmetry axis of the first deflector and an offset of the symmetry axis of the second deflector is in a range of 0 to 0.5 pixel dimension.

In some embodiments, the image sensor further includes a lens layer disposed on the covering layer.

In some embodiments, the first deflector continuously extends from a bottom surface of the covering layer to a top surface of the first color filter to cover and surround the first color filter.

In some embodiments, the image sensor further includes a first lens disposed above the first deflector. The symmetry axis of a deep trench isolation below the first color filter, a symmetry axis of first deflector, and a symmetry axis of the covering layer are misaligned with each other. An offset of the symmetry axis of the first deflector is less than an offset of the symmetry axis of the first lens.

In some embodiments, a difference value between the offset of the symmetry axis of the first deflector and the offset of the symmetry axis of the first lens is in a range from 0.1 to 0.8 pixel dimension.

In some embodiments, the image sensor further includes a buffer layer disposed between the first color filter and the first deflector. The refractive index of the first deflector is greater than a refractive index of the buffer layer, and the refractive index of the buffer layer is greater than a refractive index of the first color filter.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
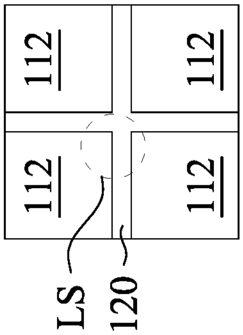
FIG. 2 is a partially top view of FIG. 1.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
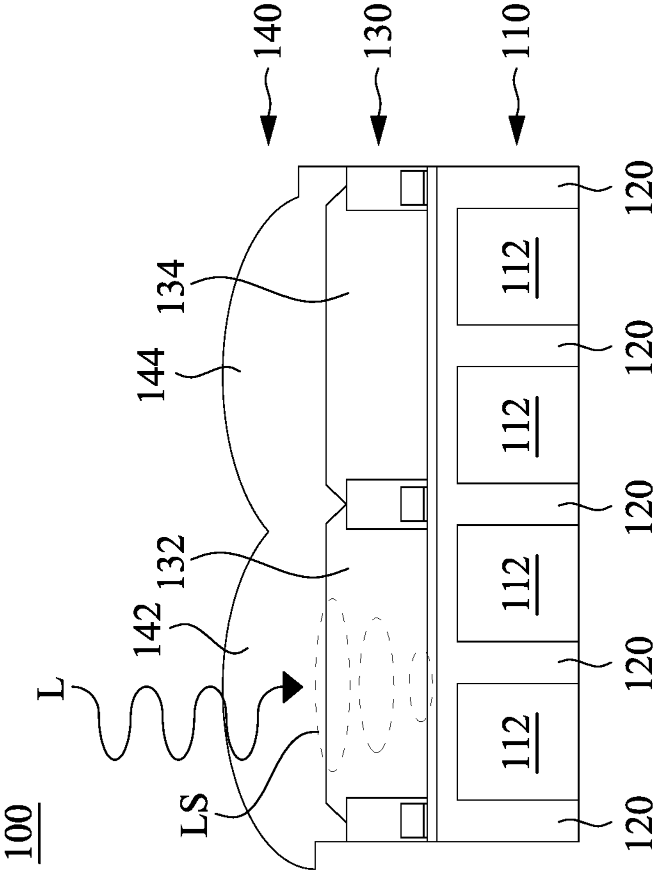
FIG. 1 is a cross-sectional view of an image sensor of a comparative embodiment of the present disclosure.

FIG. 1 is a cross-sectional view of an image sensor 100 of a comparative embodiment of the present disclosure. As shown in FIG. 1, the image sensor 1000 includes a photoelectric conversion layer 110, a plurality of deep trench isolations (DTIs) 120, a color filter layer 130, and a lens layer 140. The photoelectric conversion layer 110 includes a plurality of photodiodes (PDs) 112 and each of the PDs 112 is separated by the DTIs 120. The color filter layer 130 includes a color filter 132 and a color filter 134. One color filter (such as the color filter 132 and the color filter 134) corresponds to at least two PDs 112, as shown in FIG. 1. The lens layer 140 includes a lens 142 and a lens 144. The lens layer 140 is misaligned with the color filter layer 130 and the PDs 112. Specifically, a symmetry axis of the lens 142 is misaligned with a symmetry axis of the color filter 132 and a symmetry axis of the DTI 120 below the middle of the color filter 132.

FIG. 2 is a partially top view of FIG. 1, in which some elements are not illustrated for clarity. Please refer to FIG. 1 and FIG. 2. When an external light L propagates to the PDs 112 through the lens 142 and the color filter 132, a light-spot LS is shifted because the lens 142 is misaligned with the color filter 132, so that each of the PDs 112 below the color filter 132 receive different energy distribution of the external light L. More specifically, as shown in FIG. 2, the light-spot LS is not at the center of the four PDs 112 so that each of the PDs 112 in FIG. 2 receives different energy distribution of the external light L. The light-spot shifting issue mentioned above could be referred to as "channel imbalance."

The present disclosure provides several image sensors and each image sensor includes a phase modulator. The arrangement of the phase modulator can uniformly distribute the external light into photodiodes below the phase modulator so that photodiodes can detect the uniform intensity of the light, thereby avoiding the channel imbalance issue and increasing the performance of the image sensor.

Figure 3:
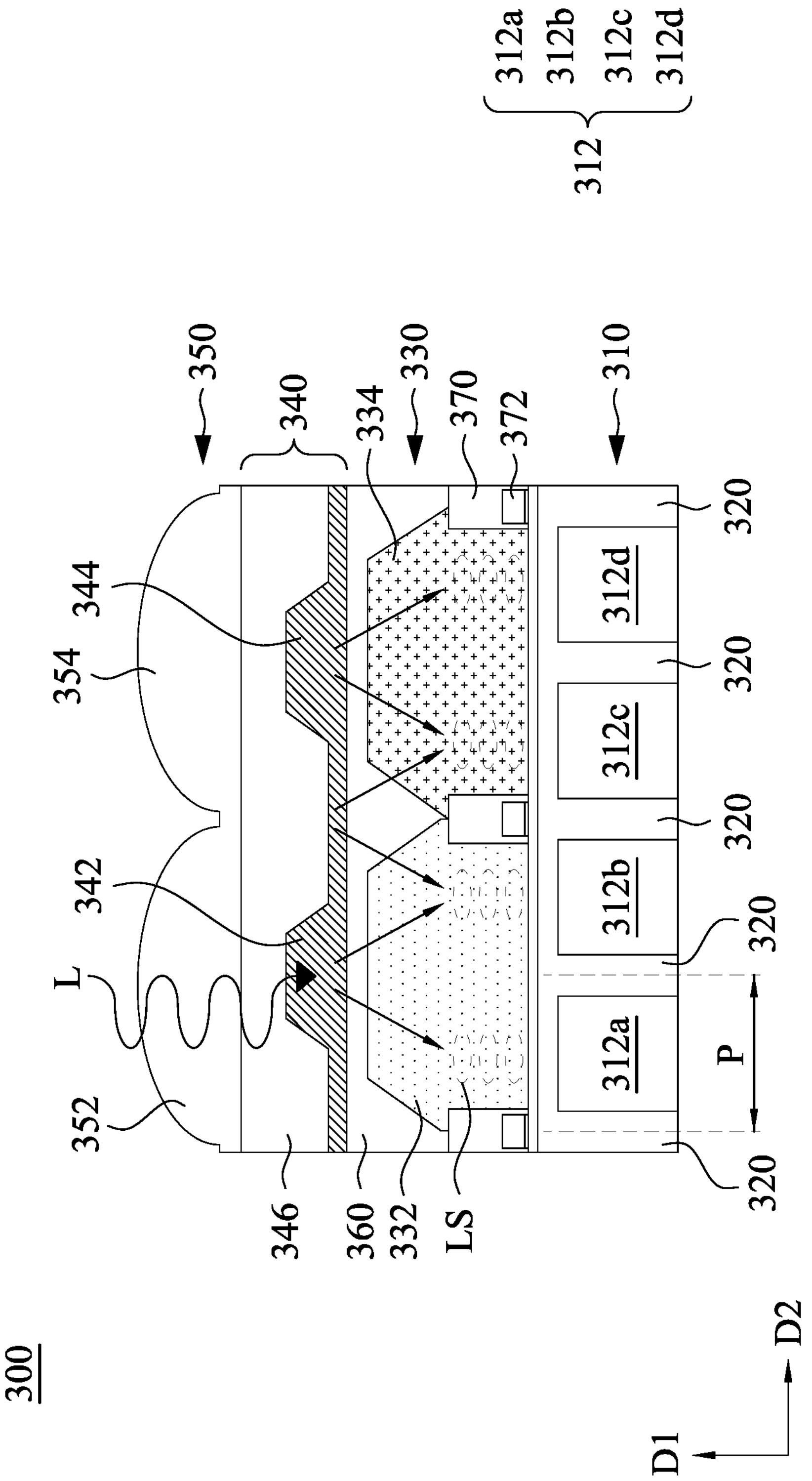
FIG. 3 is a cross-sectional view of an image sensor in accordance with some embodiments of the present disclosure.

FIG. 3 is a cross-sectional view of an image sensor 300 in accordance with some embodiments of the present disclosure. The image sensor 300 includes a photoelectric conversion layer 310, a plurality of DTIs 320, a color filter layer 330, a phase modulator 340, and a lens layer 350. The photoelectric conversion layer 310 includes a plurality of PDs 312 (including a PD 312*a*, a PD 312*b*, a PD 312*c*, and a PD 312*d*), and each of the PDs 312*a*-312*d* is separated by the DTIs 320. The color filter layer 330 includes a color filter 332 and a color filter 334. The color filter 332 is disposed on the PD 312*a* and the PD 312*b*, and the color filter 334 is disposed on the PD 312*c* and the PD 312*d*. The phase modulator 340 includes a deflector 342, a deflector 344, and a covering layer 346. The lens layer 350 is disposed on the covering layer 346. The covering layer 346 covers and surrounds the deflector 342 and the deflector 344. The deflector 342 is disposed on the color filter 332, and the deflector 344 is disposed on the color filter 334. The deflector 342 is spaced apart from the deflector 344. Both of the deflector 342 and the deflector 344 extend along a first direction D1 and arranged in a second direction D2 perpendicular to the first direction D1. The lens layer 350 includes a lens 352 and a lens 354. The lens layer 350 is disposed on the phase modulator 340. Specifically, the deflector 342 and the deflector 344 are disposed between the color filter layer 330 and the lens layer 350. The image sensor 300 further includes an oxide grid 370 and a metal grid 372 in the oxide grid 370. The oxide grid 370 and the metal grid 372 are configured to prevent the light propagating through different color filters, thereby reducing the cross-talk.

Still refer to FIG. 3. In some embodiments, a buffer layer 360 is disposed between the color filter layer 330 and the phase modulator 340. In some embodiments, a refractive index of the deflector 342 is greater than a refractive index of the buffer layer 360, and the refractive index of the buffer layer 360 is greater than a refractive index of the color filter layer 330. In some embodiments, a material of the covering layer 346 is the same as a material of the lens layer 350. In some embodiments, a refractive index of the covering layer 346 is greater than the refractive index of the deflector 342. In some embodiments, a difference value between the refractive index of the covering layer 346 and the refractive index of the deflector 342 is in a range from 0.15 to 0.6, such as 0.2, 0.25, 0.3, 0.35, 0.4, 0.45, 0.5, or 0.55.

The phase modulator 340 (including the deflector 342, the deflector 344, and the covering layer 346) is configured to uniformly distribute the external light L. Specifically, since the refractive indexes of the covering layer 346 and the deflector 342 are different, the traveling speeds of the light L in the covering layer 346 and the deflector 342 are also different, thereby causing phase difference. The phase difference could cause the light interference and then forming multiple light spots with similar intensities, as shown in FIG. 3. Therefore, the PDs 312*a*-312*d* below the color filter layer 330 could detect uniform intensity of the light L. In other words, with the arrangement of the phase modulator 340 having different elements with different refractive indexes, the channel imbalance issue mentioned in FIG. 1 and FIG. 2 could be improved. The phase difference (δ) could be calculated by the following equation:

$$\delta = \frac{2\pi d}{\lambda}(n_m - n_0)$$

where d is a height (i.e. a height H1 shown FIG. 10) of the deflector 342, λ is a wavelength of the external light L, $n_m$ is the refractive index of the covering layer 346, and no is the refractive index of the deflector 342.

If the difference value between the refractive index of the covering layer 346 and the refractive index of the deflector 342 is less than 0.15, it may not have sufficient phase difference to cause the light interference and then forming multiple light spots with similar intensities. If the difference value between the refractive index of the covering layer 346 and the refractive index of the deflector 342 is greater than 0.6, it may not have a positive impact on the performance of the image sensor 300.

Please refer to FIG. 3 again. Each of the color filter 332 and the color filter 334 could be a red, green, blue, white, yellow, cyan, magenta, or other color filter. In some embodiments, the color filter 332 could be different from the color filter 334, as shown in FIG. 3. In other embodiments, the color filter 332 could be the same as the color filter 334. The size of each deflector between different color filters could be adjusted depending on the design and/or process requirements. The color filter layer 330 could include GRB filters, GRBC filters, RYYB filters, CMY filters, or other combination filters. As shown in FIG. 3, a pixel dimension P in the present disclosure is determined by a distance between two adjacent DTIs 320. The pixel dimension P could be understood as a width pixel dimension or a length pixel dimension.

FIG. 4 to FIG. 7 are top views of the image sensor 300 of FIG. 3 in accordance with different embodiments of the present disclosure. Specifically, an image sensor 300A taken along a sectional line A-A' of FIG. 4 could be the image sensor 300 of FIG. 3. An image sensor 300B taken along a sectional line B-B' of FIG. 5 could be the image sensor 300 of FIG. 3. An image sensor 300C taken along a sectional line C-C' of FIG. 6 could be the image sensor 300 of FIG. 3. An image sensor 300D taken along a sectional line D-D' of FIG. 7 could be the image sensor 300 of FIG. 3.

Figure 5:
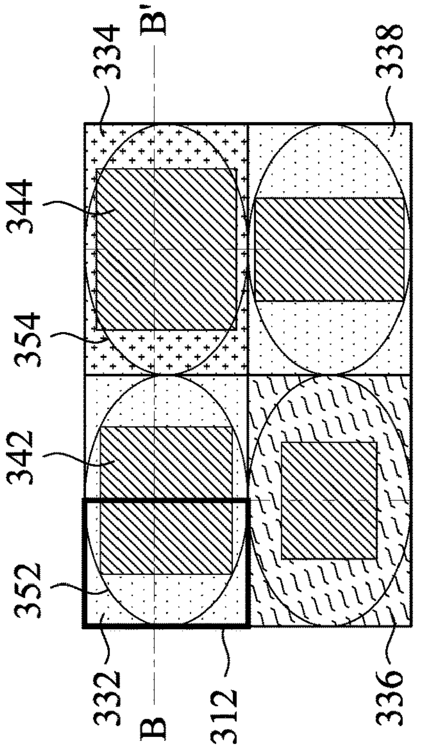
FIG. 4 to FIG. 7 are top views of the image sensor of FIG. 3 in accordance with different embodiments of the present disclosure.
Figure 4:
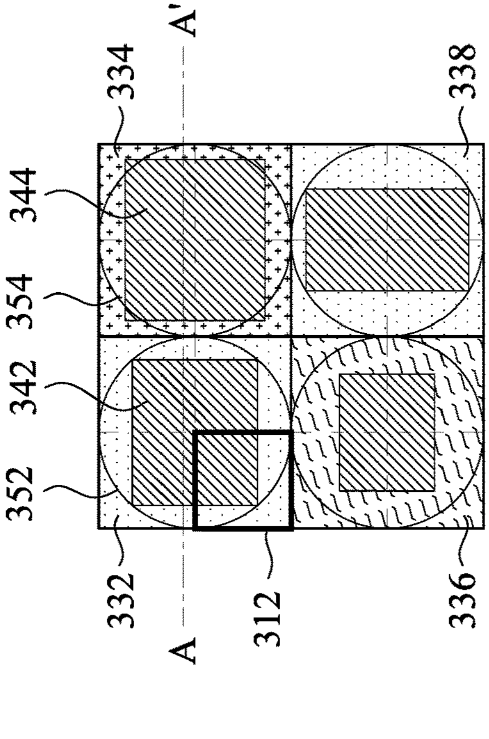
Figure 7:
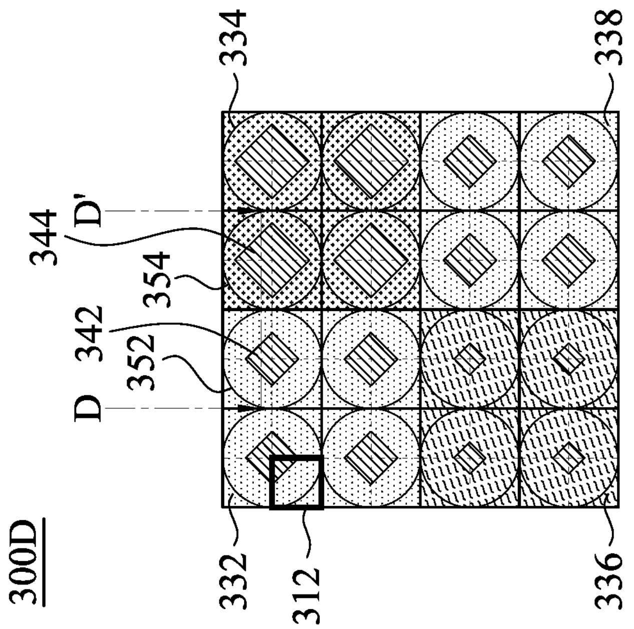
Figure 6:
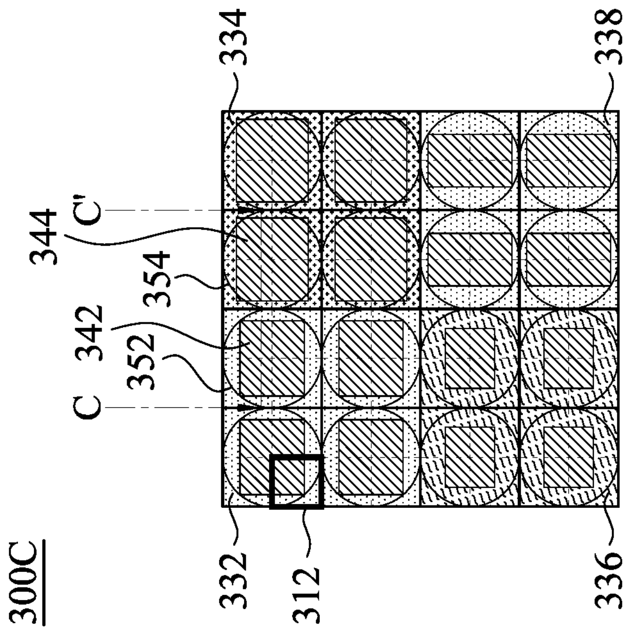

The image sensor 300 of FIG. 3 could be applied as a $(2n)^2$ C scheme (such as 4 C, 16 C, or 36 C), a $(2n-1)^2$ C scheme (such as 9 C or 25 C), and dual PD (DPD), in which n is a positive integer. It is understood that the "C" herein represents the number of PDs corresponding to one color filter. Specifically, FIG. 4 is a 4 C scheme, in which one color filter (such as the color filter 332, 334, 336, 338) corresponds to four PDs 312. FIG. 5 is a dual PD (DPD) scheme, in which one color filter (such as the color filter 332, 334, 336, 338) corresponds to two PDs 312. FIG. 6 is a 16 C scheme, in which one color filter (such as the color filter 332, 334, 336, 338) corresponds to 16 PDs 312. FIG. 7 is a 16 C scheme, in which one color filter (such as the color filter 332, 334, 336, 338) corresponds to 16 PDs 312. In FIG. 4, FIG. 6, and FIG. 7, the deflector 342 and the lens 352 correspond to four PDs 312, and the deflector 344 and the lens 354 correspond to four PDs 312. In FIG. 5, the deflector 342 and the lens 352 correspond to two PDs 312, and the deflector 344 and the lens 354 correspond to two PDs 312.

Each of the image sensor 300A of FIG. 4, the image sensor 300B of FIG. 5, the image sensor 300C of FIG. 6, and the image sensor 300D of FIG. 7 includes the color filter 332, the color filter 334, a color filter 336, and a color filter 338. Each of the color filter 332, the color filter 334, the color filter 336, and the color filter 338 could be a red, green, blue, white, yellow, cyan, magenta, or other color filter. In some embodiments, each of the color filter 332, the color filter 334, the color filter 336, and the color filter 338 are different from each other. In some embodiments, the color filter 332 could be the same as the color filter 338, as shown in FIG. 4 to FIG. 7. It is understood that the size of each deflector between different color filters could be adjusted depending on the design and/or process requirements. For example, the size of the deflector 342 on the color filter 332 is smaller than the size of the deflector 344 on the color filter 334. The size of the deflector 342 on the color filter 332 is greater than the size of the deflector on the color filter 336. The size of the deflector 342 on the color filter 332 is different from the size of the deflector on the color filter 338. In some embodiments, as shown in FIG. 7, each of the deflectors could be a diamond shape.

Figure 8:
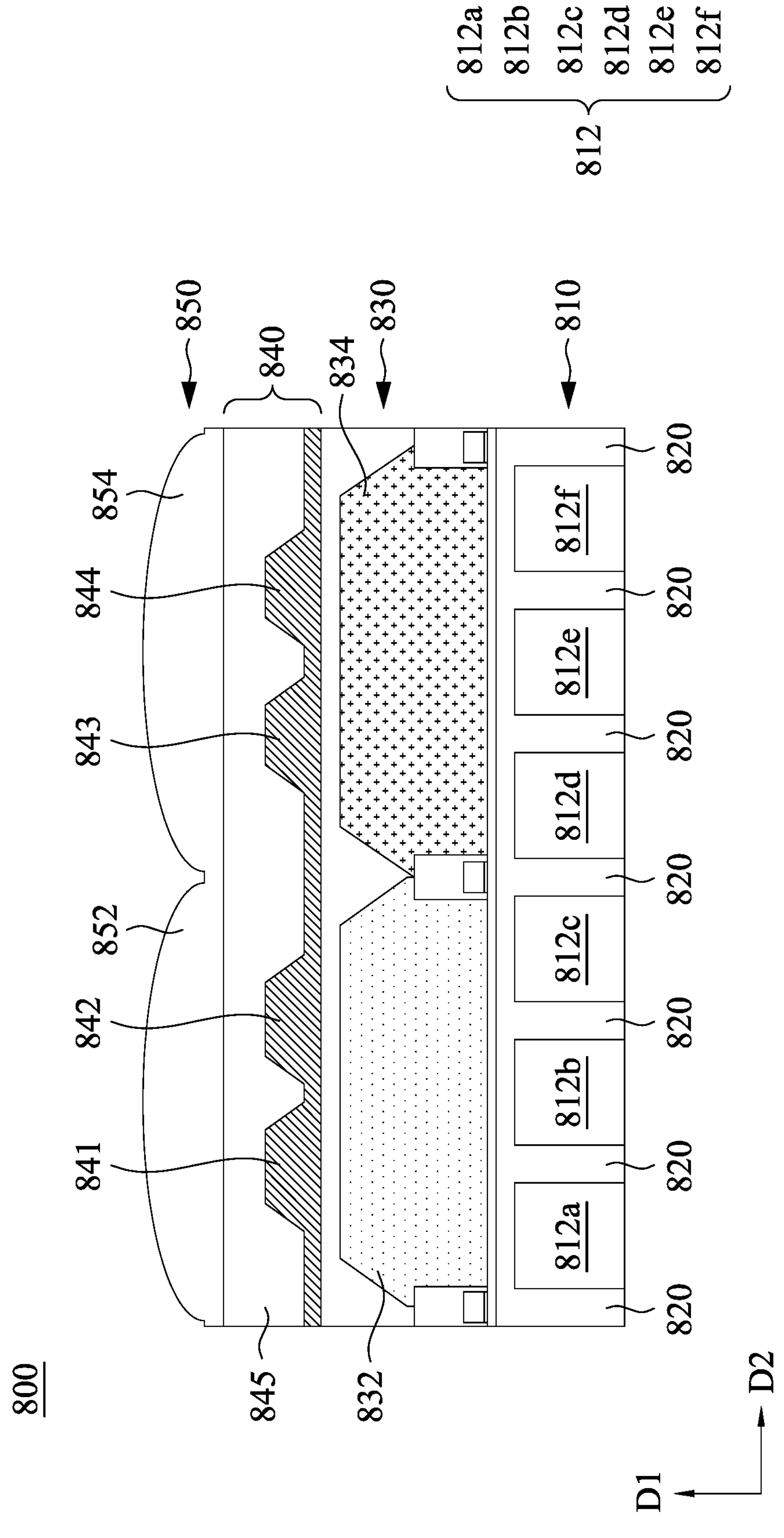
FIG. 8 is a cross-sectional view of an image sensor in accordance with one embodiment of the present disclosure.

FIG. 8 is a cross-sectional view of an image sensor 800 in accordance with one embodiment of the present disclosure. The differences between the image sensor 800 in FIG. 8 and the image sensor 300 in FIG. 3 are the amounts of the deflector, PD, and DTI, in which the size of each deflector between different color filters could be adjusted depending on the design and/or process requirements. Specifically, a plurality of PDs 812 (including PDs 812*a*~812*f*) and each of the PDs 812*a*~812*f* is separated by the DTIs 820. A color filter 832 of a color filter layer 830 corresponds to three PDs 812*a*~812*c*, and a color filter 834 of the color filter layer 830 corresponds to three PDs 812*d*~812*f*. A phase modulator 840 is disposed between the color filter layer 830 and a lens layer 850. The color filter 832 corresponds to two deflectors 841, 842. The color filter 834 corresponds to two deflectors 843, 844. The deflectors 843, 844 are spaced apart from the deflectors 841, 842. The deflectors 843, 844 extends along the first direction and arranged in the second direction. The deflectors 841~844 are surrounded and covered by a covering layer 845. A lens 852 corresponds to the deflectors 841, 842. A lens 854 corresponds to the deflector 843, 844.

Figure 9:
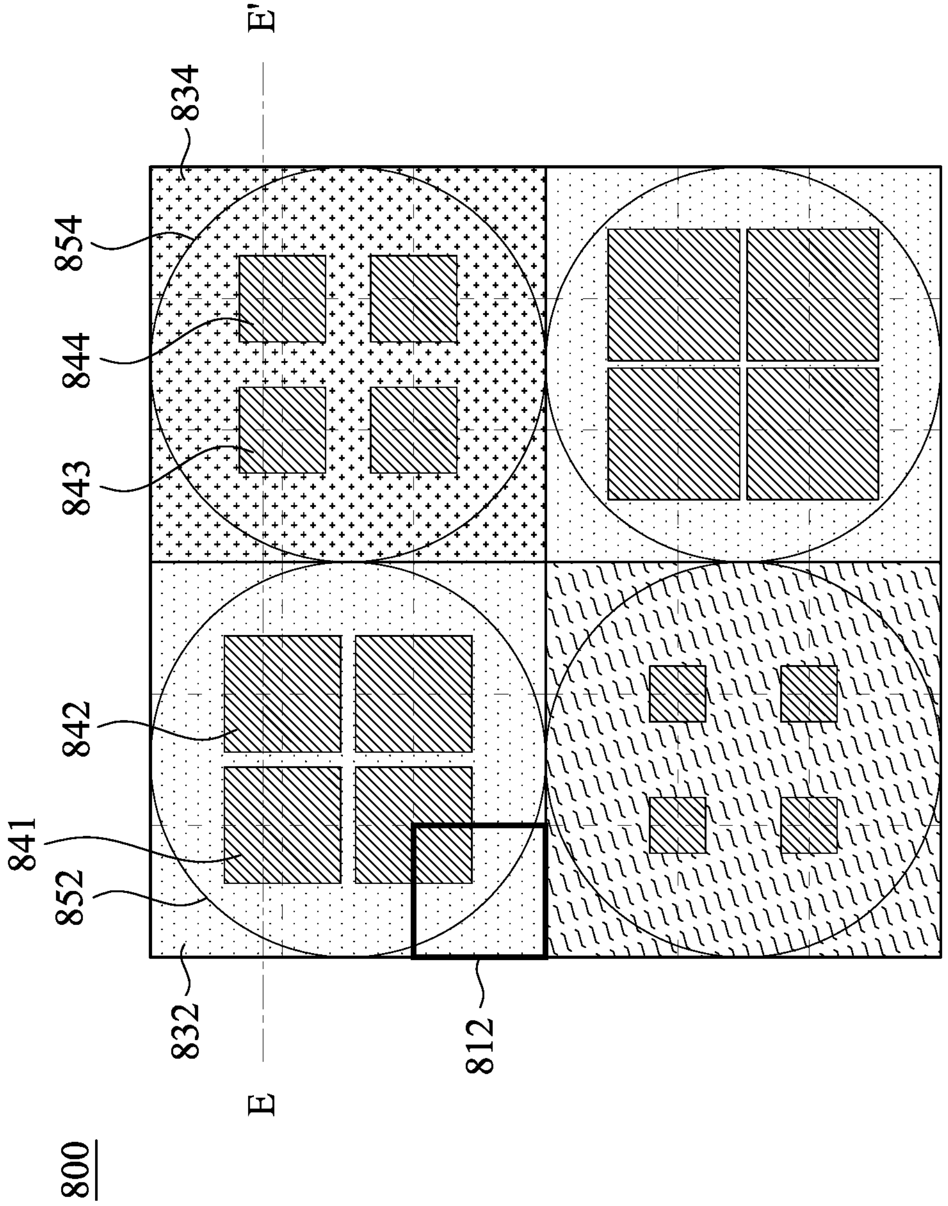
FIG. 9 is a top view of the image sensor of FIG. 8.

FIG. 9 is a top view of the image sensor 800 of FIG. 8, in which some elements are not illustrated for clarity. The image sensor 800 taken along a sectional line E-E' of FIG. 9 is the cross-sectional view of FIG. 8. The image sensor 800 of FIG. 8 and FIG. 9 is a 9 C scheme, in which one color filter corresponds to 9 PDs 812. Each of the deflectors 841~844 corresponds to four PDs 812.

Figure 10:
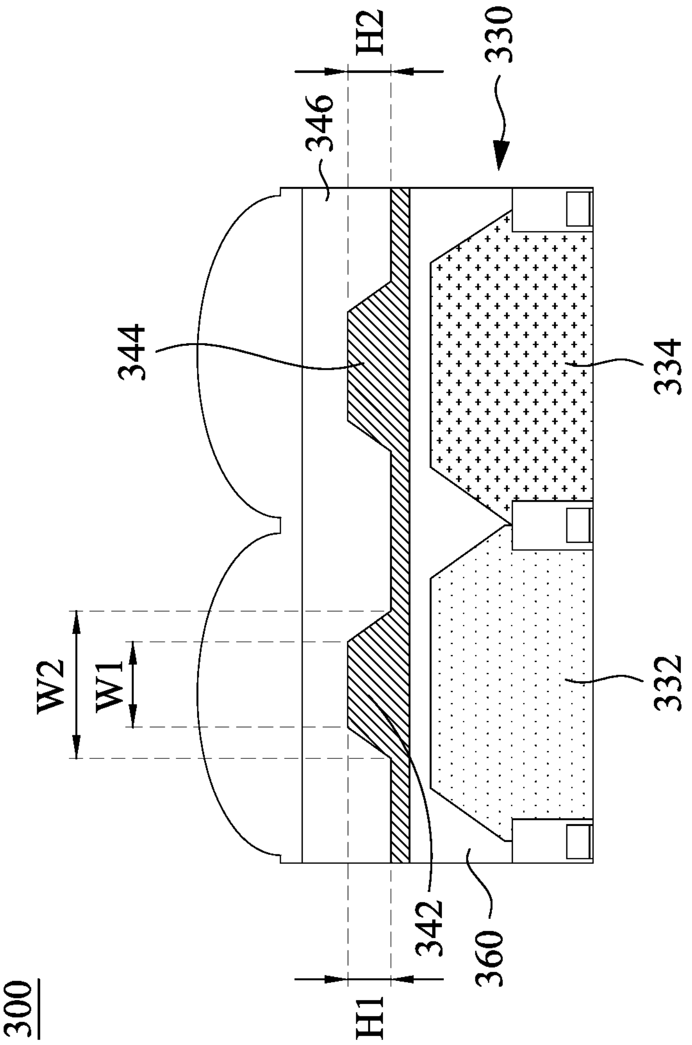
FIG. 10 is a partial view of the image sensor of FIG. 3.

FIG. 10 is a partial view of the image sensor 300 of FIG. 3, in which some elements are not illustrated for clarity. In some embodiments, a ratio of a top width W1 of the deflector 342 to a bottom width W2 of the deflector 342 is in a range from ¼ to 1, such as 0.3, 0.4, 0.5, 0.6, 0.7, 0.8, or 0.9. If the ratio is less than ¼ or greater than 1, it may not cause uniform distribution of the external light L in the image sensor 300. In some embodiments, a first height H1 of the deflector 342 is in a range from 150 nm to 800 nm. In some embodiments, a second height H2 of the deflector 344 is in a range from 150 nm to 800 nm. In some embodiments, the first height H1 is the same as the second height H2. In some embodiments, the first height H1 is different from the second height H2. If the first height H1 and/or the second height H2 are/is less than 150 nm or greater than 800 nm, it may not cause uniform distribution of the external light L in the image sensor 300. It is understood that the number and size (such as the top width W1, the bottom width W2, the first height H1, and the second height H2) of the deflectors could be adjusted depending on the requirements to achieve the uniform distribution of the light L into the PDs.

Similar features are labeled by the similar numerical references, and descriptions of the same features are not repeated in the following figures.

Figure 11:
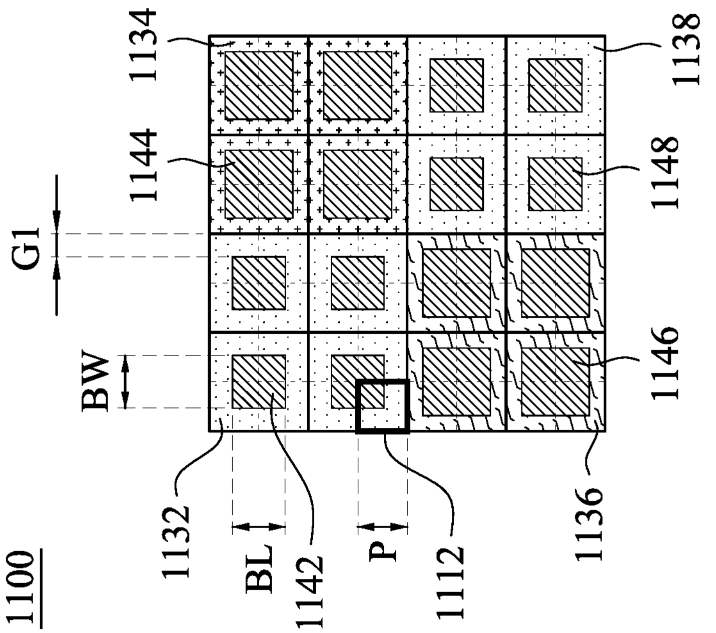
FIG. 11 is a top view of an image sensor in accordance with one embodiment of the present disclosure.

FIG. 11 is a top view of an image sensor 1100 in accordance with one embodiment of the present disclosure. The image sensor 1100 includes a plurality of color filters (including color filters 1132, 1134, 1136, 1138), a plurality of deflectors (including deflectors 1142, 1144, 1146, 1148) disposed on the color filters, and a plurality of PDs 1112 under the color filters 1132, 1134, 1136, 1138. The deflector 1142 has a bottom width BW and a bottom length BL. Each PD 1112 has a pixel dimension P (a width pixel dimension or a length pixel dimension). In some embodiments, a ratio of the bottom width BW or the bottom length BL of the deflector 1142 to the pixel dimension P is in a range from 1 to 1.8. In some embodiments, the bottom width BW of the deflector 1142 is the same as the bottom length BL of the deflector 1142. In some embodiments, a gap G1 between a sidewall of the color filter 1132 and a sidewall of a bottom of the deflector 1142 is in a range from 0.1 to 0.5 pixel dimension P. It should be understood that the above-mentioned ranges in FIG. 11 also could be applied to the deflectors 1144, 1146, 1148, the color filters 1134, 1136, 1138, and the gaps thereof.

Figure 12:
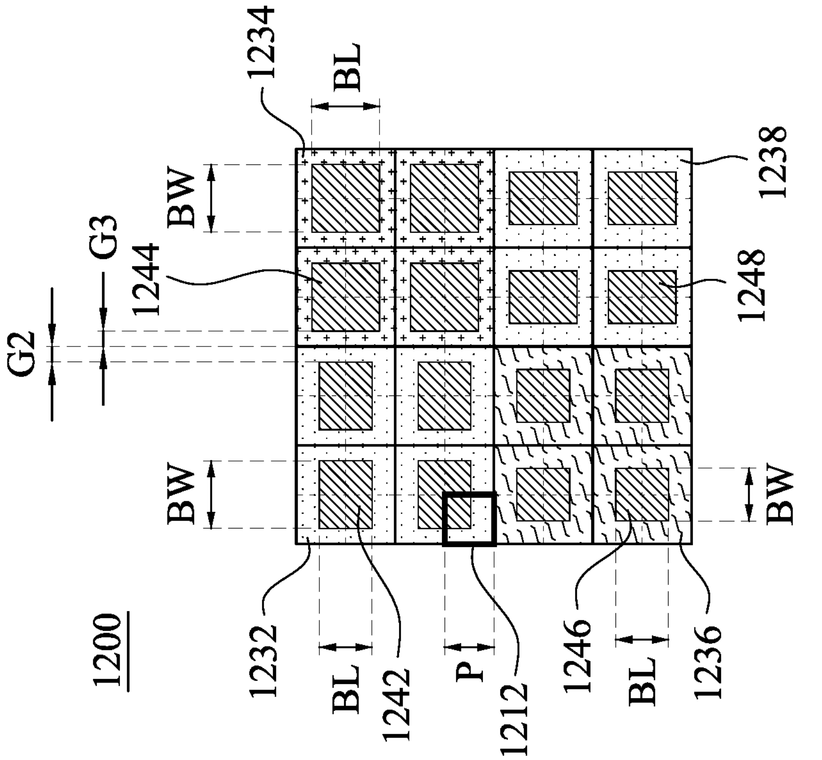
FIG. 12 is a top view of an image sensor in accordance with another embodiment of the present disclosure.

FIG. 12 is a top view of an image sensor 1200 in accordance with another embodiment of the present disclosure. The image sensor 1200 includes a plurality of color filters (including color filters 1232, 1234, 1236, 1238), a plurality of deflectors (including deflectors 1242, 1244, 1246, 1248) disposed on the color filters, and a plurality of PDs 1212 under the color filters 1232, 1234, 1236, 1238. The deflector 1242 has a bottom width BW and a bottom length BL. Each PD 1212 has a pixel dimension P (a width pixel dimension or a length pixel dimension). In some embodiments, a ratio of the bottom width BW or the bottom length BL of the deflector 1242 to the pixel dimension P is in a range from 1 to 1.8. In some embodiments, the bottom width BW of the deflector 1242 is different from the bottom length BL of the deflector 1242. In some embodiments, a difference value between the bottom width BW and the bottom length BL of the deflector 1242 is in a range from 0.1 to 0.5 pixel dimension P. In some embodiments, a gap G2 between a sidewall of the color filter 1232 and a sidewall of a bottom of the deflector 1242 is the same as a gap G3 between a sidewall of the color filter 1234 and a sidewall of a bottom of the deflector 1244, wherein the gap G2 is in a range from less than 0.4 pixel dimension P.

Still refer to FIG. 12. In some embodiments, the bottom width BW of the deflector 1242 is the same as a bottom width BW of the deflector 1244, and the bottom length BL of the deflector 1242 is the same as a bottom length BL of the deflector 1246. In some embodiments, the bottom width BW of the deflector 1242 is the same as a bottom width BW of the deflector 1246, and the bottom length BL of the deflector 1242 is the same as a bottom length BL of the deflector 1244. It should be understood that the above-mentioned ranges in FIG. 12 also could be applied to the deflectors 1244, 1246, 1248, the color filters 1234, 1236, 1238, and the gaps thereof.

Figure 13:
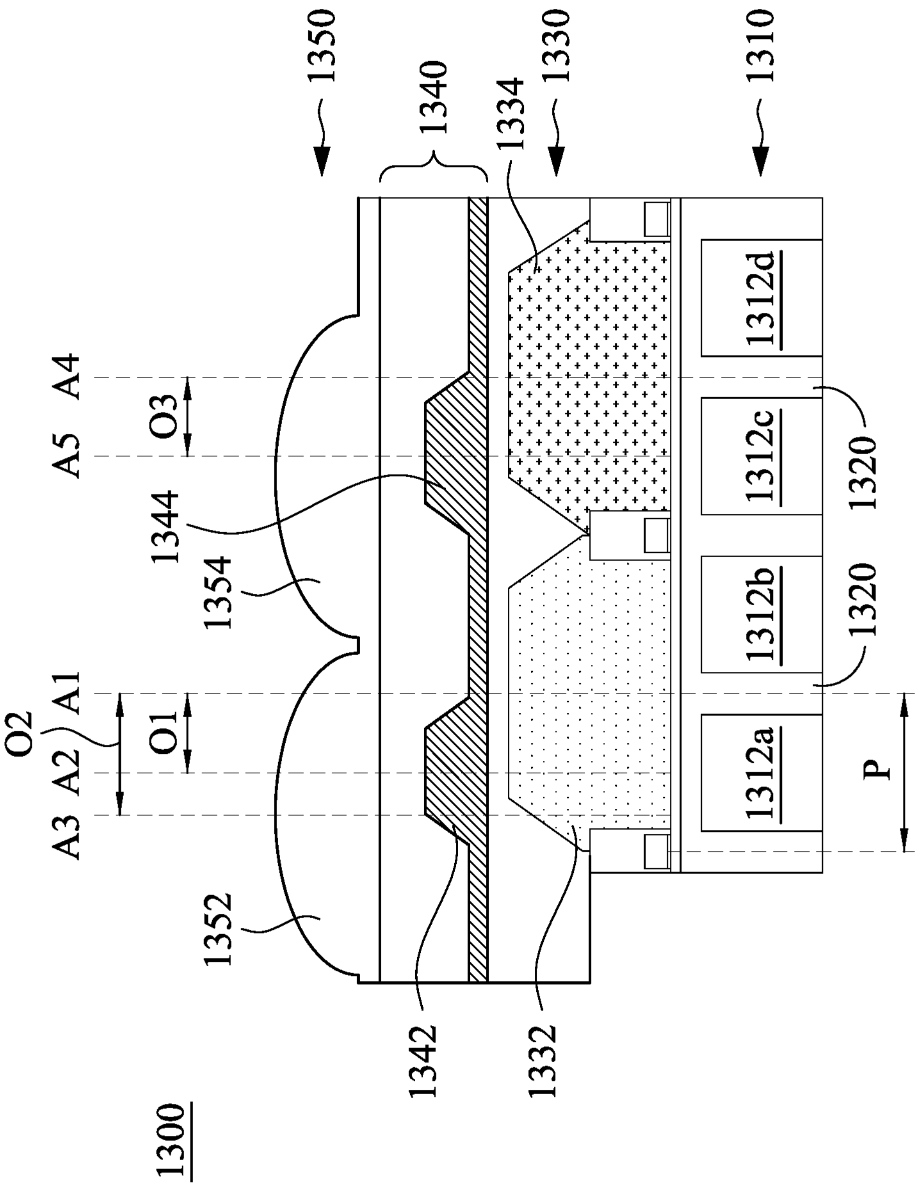
FIG. 13 is a cross-sectional view of an image sensor in accordance with one embodiment of the present disclosure.
Figure 14:
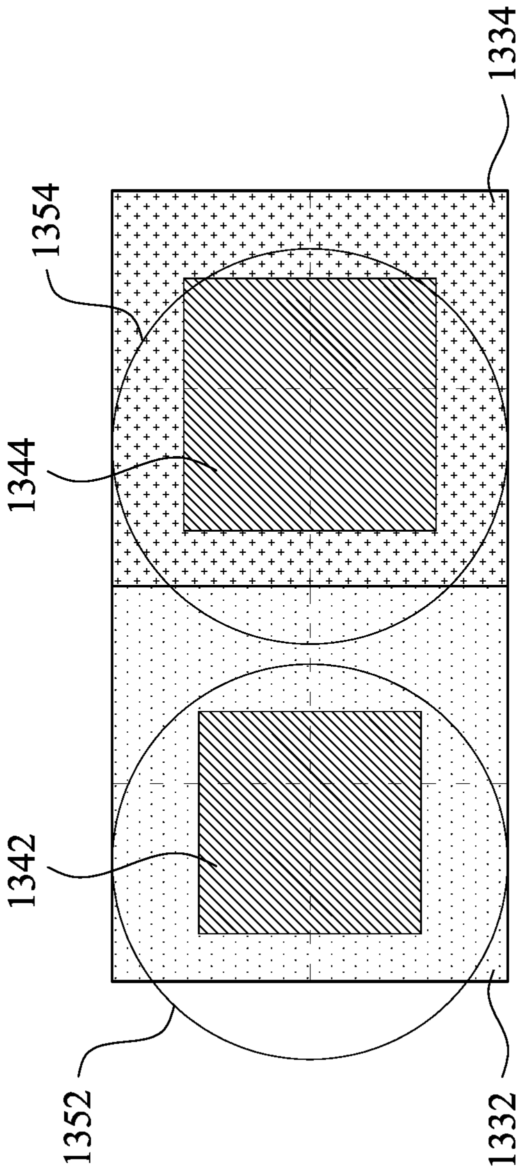
FIG. 14 is a top view of the image sensor of FIG. 13.

FIG. 13 is a cross-sectional view of an image sensor 1300 in accordance with one embodiment of the present disclosure. FIG. 14 is a top view of the image sensor 1300 of FIG. 13. The differences between the image sensor 1300 in FIG. 13 and the image sensor 300 in FIG. 3 are the relative positions of the phase modulators 340, 1340 and the lens layers 350, 1350. Specifically, in FIG. 13, a symmetry axis A1 of a DTI 1320 (below the middle of a color filter 1332) is misaligned with a symmetry axis A2 of the deflector 1342, and the symmetry axis A2 of the deflector 1342 is misaligned with a symmetry axis A3 of a lens 1352. In some embodiments, two of the symmetry axes A1, A2, A3 are misaligned with each other. In some embodiments, all of the symmetry axes A1, A2, A3 are misaligned with each other, as shown in FIG. 13.

Still refer to FIG. 13. In some embodiments, an offset O1 of the symmetry axis A2 of the deflector 1342 is less than an offset O2 of the symmetry axis A3 of the lens 1352. In some embodiments, a difference value between the offset O1 of the symmetry axis A2 of the deflector 1342 and the offset O2 of the symmetry axis A3 of the lens 1352 is in a range from 0.1 to 0.8 pixel dimension P. As shown in FIG. 13, a symmetry axis A5 of the deflector 1344 is misaligned with a symmetry axis A4 of the DTI 1320 (below the middle of a color filter 1334). In some embodiments, a difference value between the offset O1 of the symmetry axis A2 of the deflector 1342 and the offset O3 of the symmetry axis A5 of the deflector 1344 is in a range of 0 to 0.5 pixel dimension P.

Figure 16:
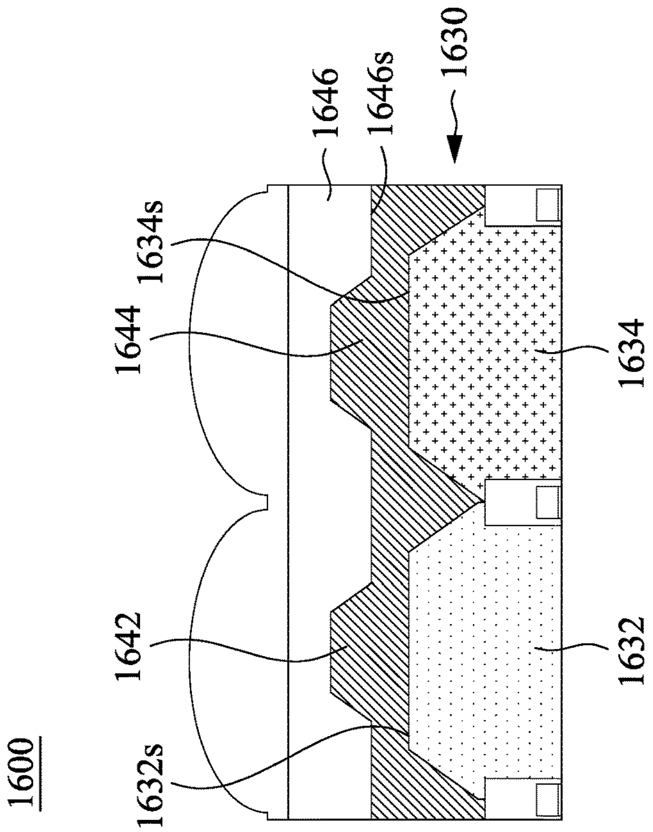
FIG. 15 to FIG. 17 are cross-sectional views of image sensors in accordance with some embodiments of the present disclosure.
Figure 15:
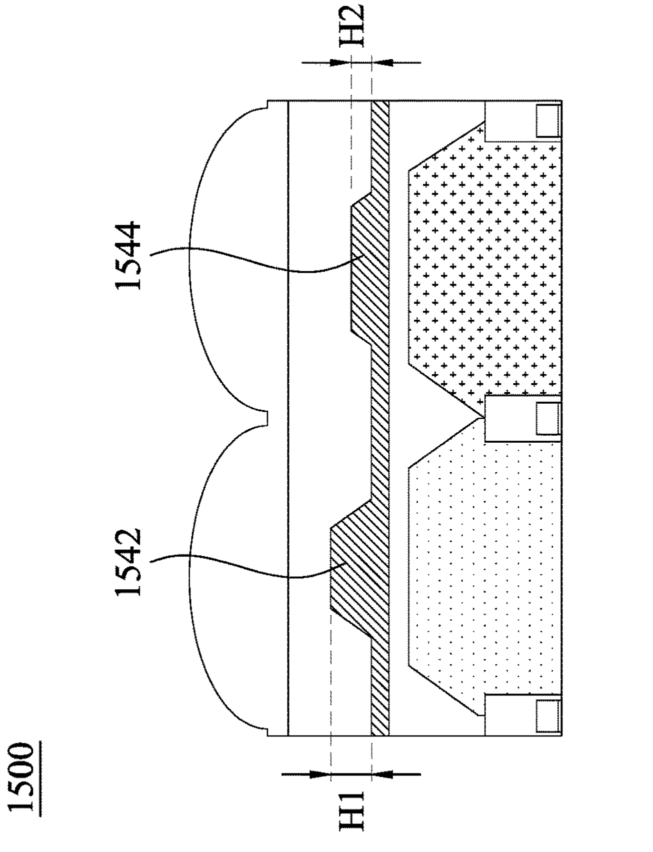

FIG. 15 and FIG. 16 are cross-sectional views of image sensors in accordance with some embodiments of the present disclosure. The difference between the image sensor 1500 in FIG. 15 and the image sensor 300 in FIG. 10 is the heights of the deflectors. Specifically, as shown in FIG. 15, a height H1 of the deflector 1542 is different from a height H2 of the deflector 1544. More specifically, the height H1 is greater than the height H2. The difference between the image sensor 1600 in FIG. 16 and the image sensor 300 in FIG. 10 is the buffer layer 360. Specifically, in FIG. 16, there is no buffer layer between a color filter layer 1630, a deflector 1642, and a deflector 1644. In other words, the deflector 1642 continuously extends from a bottom surface 1646*s* of a covering layer 1646 to a top surface 1632*s* of the color filter 1632 to cover and surround the color filter 1632. Similarly, the deflector 1644 continuously extends from the bottom surface 1646*s* of the covering layer 1646 to a top surface 1634*s* of the color filter 1634 to cover and surround the color filter 1634.

Figure 18:
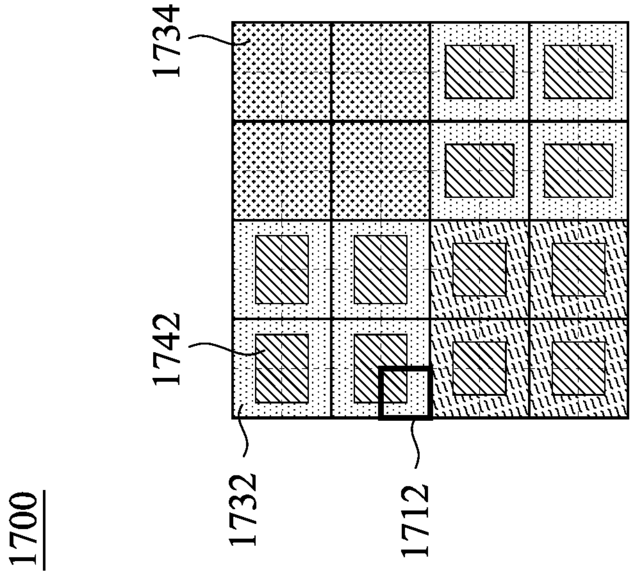
FIG. 18 is a top view of the image sensor of FIG. 17.
Figure 17:
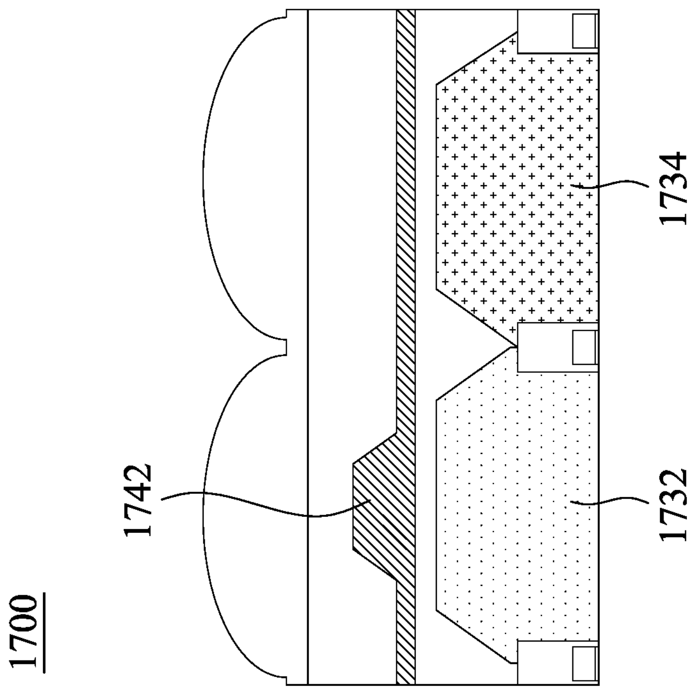

FIG. 17 is a cross-sectional view of an image sensor 1700 in accordance with some embodiments of the present disclosure. FIG. 18 is a top view of the image sensor 1700 of FIG. 17. The difference between the image sensor 1700 in FIG. 17 and the image sensor 300 in FIG. 10 is the deflector above the color filters 334, 1734. Specifically, in FIG. 17, there is no any deflector above the color filter 1734. In other words, as shown in FIG. 18, a deflector 1742 corresponds to a plurality of PDs 1712, and no deflector corresponds to the PD 1712.

Figure 19:
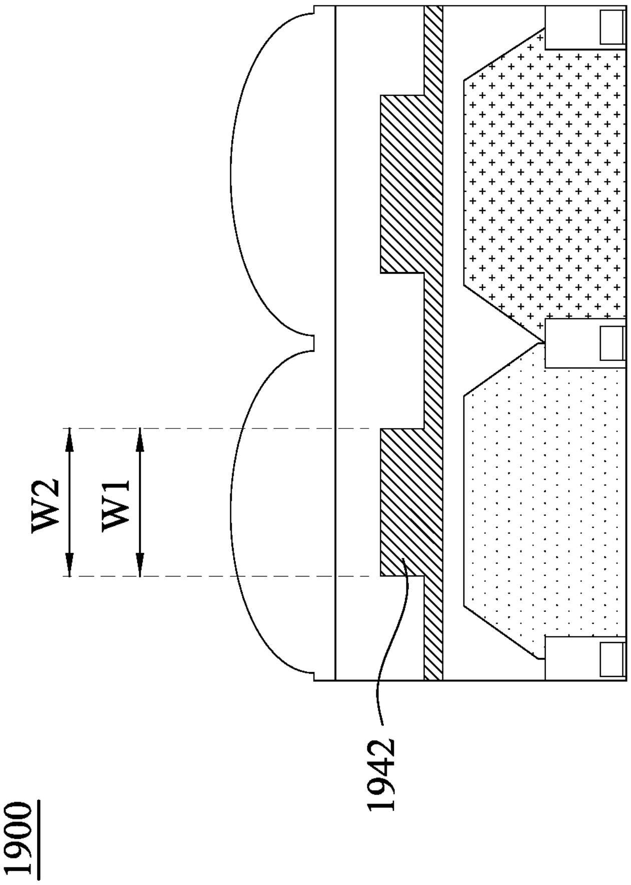
FIG. 19 is a cross-sectional view of an image sensor in accordance with some embodiments of the present disclosure.

FIG. 19 is a cross-sectional view of an image sensor 1900 in accordance with some embodiments of the present disclosure. The difference between the image sensor 1900 in FIG. 19 and the image sensor 300 in FIG. 10 is the top widths W1 and the bottom widths W2 of the deflectors 342, 1942. As shown in FIG. 19, the top width W1 of the deflector 1942 is the same with the bottom width W2 of the deflector 1942.

Figure 20:
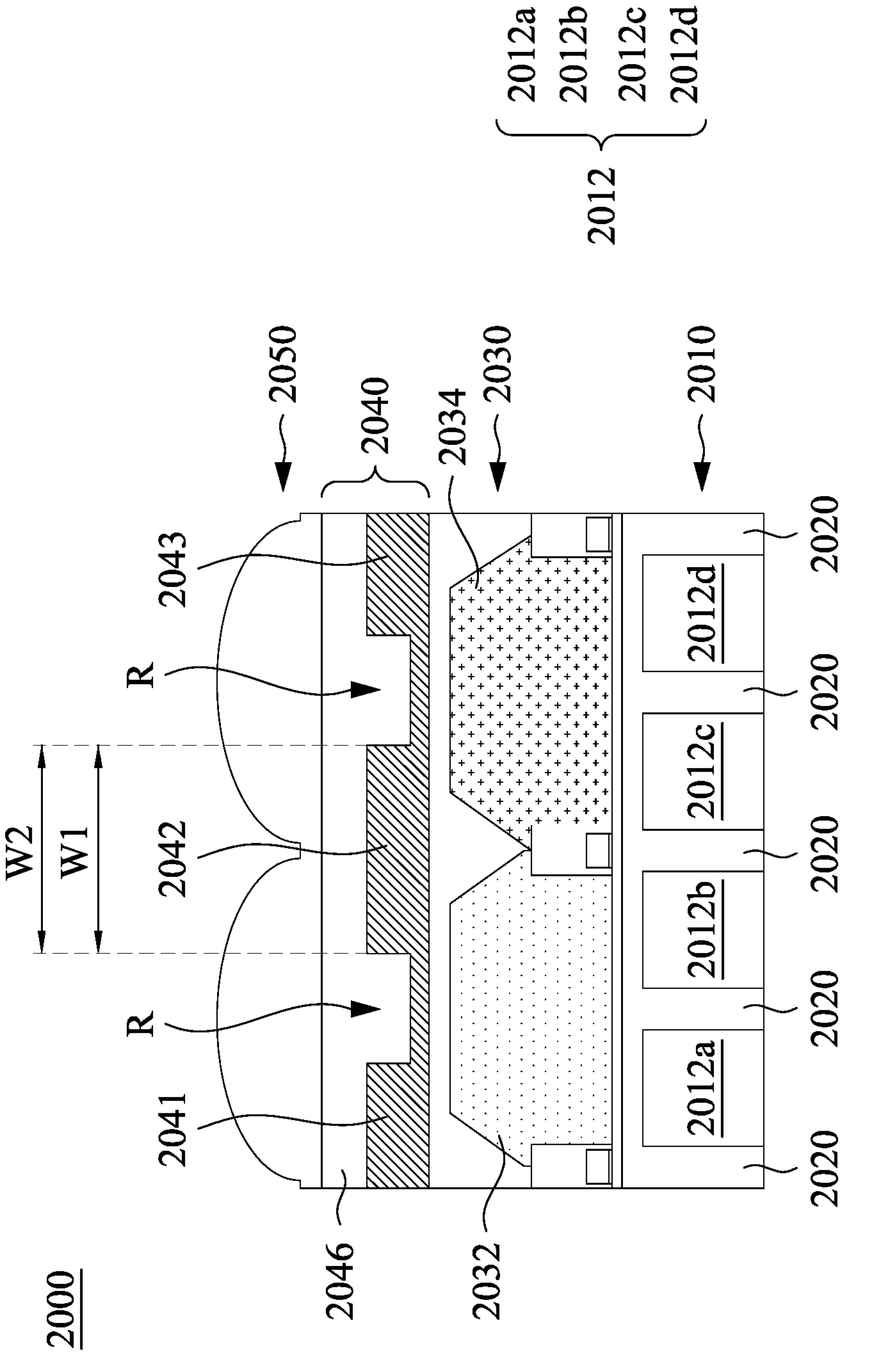
FIG. 20 is a cross-sectional view of an image sensor in accordance with some embodiments of the present disclosure.
Figure 22:
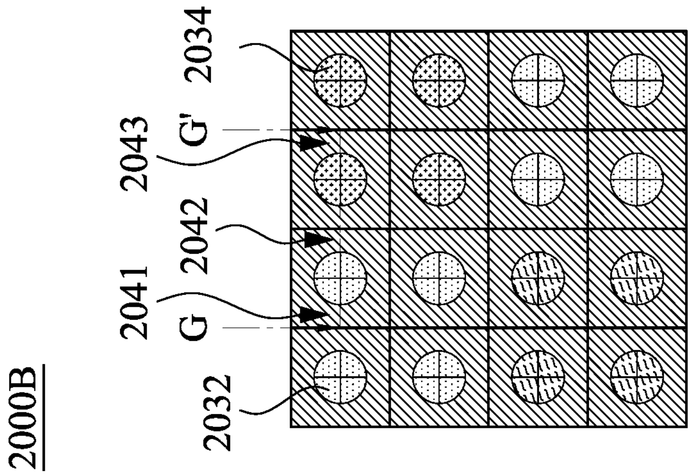
FIG. 21 and FIG. 22 are top views of the image sensor of FIG. 20 in accordance with different embodiments of the present disclosure.
Figure 21:
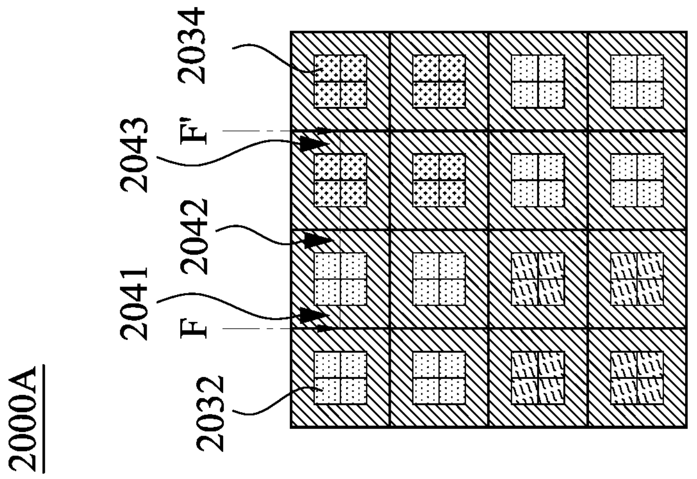

FIG. 20 is a cross-sectional view of an image sensor 2000 in accordance with some embodiments of the present disclosure. FIG. 21 and FIG. 22 are top views of the image sensor 2000 of FIG. 20 in accordance with different embodiments of the present disclosure. Specifically, an image sensor 2000A taken along a sectional line F-F' of FIG. 21 could be the image sensor 2000 of FIG. 20. An image sensor 2000B taken along a sectional line G-G' of FIG. 22 could be the image sensor 2000 of FIG. 20.

As shown in FIG. 20, a phase modulator 2040 is disposed between a color filter layer 2030 and a lens layer 2050. The phase modulator 2040 includes a plurality of deflectors 2041-2043, and each deflector 2041-2043 is separated by a recess R. A top width W1 of the deflector 2042 is the same as a bottom width W2 of the deflector 2042. As shown in FIG. 21 to FIG. 23, the deflector 2042 is disposed above a junction of a color filter 2032 and a color filter 2034. In other words, the deflector 2042 is across above the color filter 2032 and the color filter 2034.

The present disclosure provides several image sensors and each image sensor includes a phase modulator. The phase modulator includes the deflectors and the covering layer covering and surrounding the deflectors, in which deflectors and the covering layer have different refractive indexes. The arrangement of the phase modulator can uniformly distribute the external light into photodiodes below the phase modulator so that photodiodes can detect the uniform intensity of the light, thereby avoiding the channel imbalance issue and increasing the performance of the image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:

a photoelectric conversion layer comprising a first photodiode and a second photodiode;

a plurality of deep trench isolations separating the first photodiode and the second photodiode, wherein a pixel dimension is determined by a distance between two adjacent deep trench isolations;

a first color filter disposed on the first photodiode and the second photodiode;

a first deflector disposed on the first color filter; and a covering layer covering and surrounding the first deflector, wherein a refractive index of the covering layer is greater than a refractive index of the first deflector, and a difference value between the refractive index of the covering layer and the refractive index of the first deflector is in a range from 0.15 to 0.6.

2. The image sensor of claim 1, wherein a ratio of a top width of the first deflector to a bottom width of the first deflector is in a range from ¼ to 1.

3. The image sensor of claim 1, wherein a ratio of a bottom width or a bottom length of the first deflector to the pixel dimension is in a range from 1 to 1.8, and the bottom width of the first deflector is the same as the bottom length of the first deflector.

4. The image sensor of claim 1, wherein a gap between a sidewall of the first color filter and a sidewall of a bottom of the first deflector is in a range from 0.1 to 0.5 pixel dimension.

5. The image sensor of claim 1, further comprising:

a third photodiode and a fourth photodiode in the photoelectric conversion layer, wherein the plurality of deep trench isolations separate the third photodiode and the fourth photodiode;

a second color filter disposed on the third photodiode and the fourth photodiode; and a second deflector disposed on second color filter, wherein the second deflector is spaced apart from the first deflector, both of the first deflector and the second deflector extend along a first direction and arranged in a second direction perpendicular to the first direction, wherein the covering layer covers and surrounds the second deflector.

6. The image sensor of claim 5, wherein a ratio of a bottom width or a bottom length of the first deflector to the pixel dimension is in a range from 1 to 1.8, and a ratio of a bottom width or a bottom length of the second deflector to the pixel dimension is in a range from 1 to 1.8.

7. The image sensor of claim 6, wherein a difference value between the bottom width and the bottom length of the first deflector is in a range from 0.1 to 0.5 pixel dimension.

8. The image sensor of claim 5, wherein a first gap between a sidewall of the first color filter and a sidewall of a bottom of the first deflector is the same as a second gap between a sidewall of the second color filter and a sidewall of a bottom of the second deflector, wherein the first gap is in a range from less than 0.4 pixel dimension.

9. The image sensor of claim 5, wherein a first height of the first deflector is in a range from 150 nm to 800 nm, a second height of the second deflector is in a range from 150 nm to 800 nm, and the first height is different from the second height.

10. The image sensor of claim 5, further comprising:

a fifth photodiode and a sixth photodiode in the photoelectric conversion layer, wherein the plurality of deep trench isolations separate the fifth photodiode and the sixth photodiode;

a third color filter disposed on the fifth photodiode and the sixth photodiode; and a third deflector disposed on third color filter, wherein the third deflector is spaced apart from the first deflector and the second deflector, the third deflector extends along the first direction and arranged in the second direction, wherein the covering layer covers and surrounds the third deflector.

11. The image sensor of claim 10, wherein a bottom width of the first deflector is the same as a bottom width of the second deflector, and a bottom length of the first deflector is the same as a bottom length of the third deflector.

12. The image sensor of claim 10, wherein a bottom width of the first deflector is the same as a bottom width of the third deflector, and a bottom length of the first deflector is the same as a bottom length of the second deflector.

13. The image sensor of claim 5, further comprising:

a fifth photodiode and a sixth photodiode, wherein the plurality of deep trench isolations separate the fifth photodiode and the sixth photodiode; and a third color filter disposed on the fifth photodiode and the sixth photodiode, wherein the first deflector and the second deflector are free of disposed on the third color filter.

14. The image sensor of claim 5, wherein a bottom width of the first deflector is the same as a bottom length of the first deflector, wherein the first deflector is disposed above a junction of the first color filter and the second color filter.

15. The image sensor of claim 5, wherein a symmetry axis of a deep trench isolation below the first color filter is misaligned with a symmetry axis of the first deflector, and a symmetry axis of a deep trench isolation below the second color filter is misaligned with a symmetry axis of the second deflector, wherein a difference value between an offset of the symmetry axis of the first deflector and an offset of the symmetry axis of second deflector is in a range of 0 to 0.5 pixel dimension.

16. The image sensor of claim 1, further comprising a lens layer disposed on the covering layer.

17. The image sensor of claim 1, wherein the first deflector continuously extends from a bottom surface of the covering layer to a top surface of the first color filter to cover and surround the first color filter.

18. The image sensor of claim 1, further comprising a first lens disposed above the first deflector, wherein a symmetry axis of a deep trench isolation below the first color filter, a symmetry axis of first deflector, and a symmetry axis of the covering layer are misaligned with each other, wherein an offset of the symmetry axis of the first deflector is less than an offset of the symmetry axis of the first lens.

19. The image sensor of claim 18, wherein a difference value between the offset of the symmetry axis of the first deflector and the offset of the symmetry axis of the first lens is in a range from 0.1 to 0.8 pixel dimension.

20. The image sensor of claim 1, further comprising a buffer layer disposed between the first color filter and the first deflector, wherein the refractive index of the first deflector is greater than a refractive index of the buffer layer, and the refractive index of the buffer layer is greater than a refractive index of the first color filter.

* * * * *